US009203315B2

(12) United States Patent
Torti

(10) Patent No.: US 9,203,315 B2
(45) Date of Patent: Dec. 1, 2015

(54) CURRENT SENSING DEVICE FOR A MULTI-PHASE SWITCHED VOLTAGE REGULATOR

(75) Inventor: Giuseppe Torti, Alzano Scrivia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 670 days.

(21) Appl. No.: 13/470,005

(22) Filed: May 11, 2012

(65) Prior Publication Data

US 2012/0286769 A1 Nov. 15, 2012

(30) Foreign Application Priority Data

May 12, 2011 (IT) .............. MI2011A0832

(51) Int. Cl.
*G01R 19/00* (2006.01)
*H02M 3/158* (2006.01)
*G01R 29/16* (2006.01)
*H02M 1/00* (2007.01)

(52) U.S. Cl.
CPC .......... *H02M 3/1584* (2013.01); *G01R 29/16* (2013.01); *G01R 19/0092* (2013.01); *H02M 2001/0009* (2013.01)

(58) Field of Classification Search
CPC ........ G01R 11/40; G01R 11/42; G01R 11/36; G01R 21/133; G01R 21/00; G01R 19/0092; G01R 29/16; H02M 2001/0009; H03K 17/687; G05F 1/10
USPC ......................................... 324/76.77, 86, 107
See application file for complete search history.

(56) References Cited

U.S. PATENT DOCUMENTS

| | | | | |
|---|---|---|---|---|
| 3,899,731 A * | 8/1975 | Smith | ...................... | H02P 9/302 322/25 |
| 5,592,072 A * | 1/1997 | Brown | ...................... | G05F 1/62 323/268 |
| 5,982,160 A * | 11/1999 | Walters | ................. | H02M 3/156 323/222 |
| 6,215,290 B1 * | 4/2001 | Yang | .................... | H02M 3/1584 323/282 |
| 6,285,571 B1 * | 9/2001 | Brooks | ............... | H02M 3/1584 323/272 |
| 6,292,378 B1 * | 9/2001 | Brooks | ............... | H02M 3/1584 323/272 |
| 6,404,175 B1 * | 6/2002 | Yang | .................... | H02M 3/1584 323/222 |
| 6,433,527 B1 * | 8/2002 | Izadinia | ............. | H02M 3/1584 323/300 |
| 6,462,521 B1 * | 10/2002 | Yang | .................... | H02M 3/1584 323/272 |
| 6,465,993 B1 * | 10/2002 | Clarkin | ................. | H02M 3/156 323/272 |
| 6,583,610 B2 * | 6/2003 | Groom | .................. | H02M 3/156 323/224 |

(Continued)

FOREIGN PATENT DOCUMENTS

JP  2002-297248 A * 10/2002 ................ G05F 1/56

*Primary Examiner* — Patrick Assouad
*Assistant Examiner* — Sean Curtis
(74) *Attorney, Agent, or Firm* — Seed IP Law Group PLLC

(57) ABSTRACT

A current sensor includes input modules each including an amplifier having a first input coupled to a respective winding of a regulator; a transistor having a control input coupled to the amplifier output, a first terminal coupled to a second input of the operational amplifier, and a second terminal configured to provide a sense current representing an unbalance of a phase current with respect to an average current of a winding; a current generator configured to bias the transistor; and an output resistor coupling the first terminal to an intermediate node. An output stage includes an output amplifier having a first input coupled to the intermediate node, and an output transistor having a control terminal coupled to the output amplifier output, a first terminal coupled to a second input of the output amplifier, and a second terminal providing another sense current representing a total current of the regulator.

8 Claims, 5 Drawing Sheets

(56) References Cited

U.S. PATENT DOCUMENTS

| | | | |
|---|---|---|---|
| 6,628,106 B1 * | 9/2003 | Batarseh | H02M 3/1584 323/222 |
| 6,670,794 B1 * | 12/2003 | Wang | H02M 3/1584 323/213 |
| 6,683,441 B2 * | 1/2004 | Schiff | H02M 3/1584 323/222 |
| 7,019,507 B1 * | 3/2006 | Dittmer | H02M 1/32 323/271 |
| 7,262,628 B2 * | 8/2007 | Southwell | H02M 3/1584 323/266 |
| RE39,976 E * | 1/2008 | Schiff | H02M 3/1584 323/222 |
| 7,466,894 B2 * | 12/2008 | Schiff | H02M 3/156 323/282 |
| 7,889,525 B2 * | 2/2011 | Moussaoui | H02M 3/1584 323/268 |
| 7,960,951 B2 * | 6/2011 | Southwell | H02M 3/1584 323/220 |
| 8,044,645 B2 * | 10/2011 | Zambetti | H02M 3/1584 323/272 |
| 8,072,200 B1 * | 12/2011 | Qiu | G01R 19/0092 323/282 |
| 8,253,405 B2 * | 8/2012 | Trivedi | G06F 1/26 323/283 |
| 8,258,770 B2 * | 9/2012 | Wu | H02M 3/1584 323/285 |
| 8,400,778 B2 * | 3/2013 | Hsing | H03K 17/687 250/551 |
| 8,441,241 B2 * | 5/2013 | Krishnamurthy | H02M 3/1584 323/272 |
| 8,558,523 B2 * | 10/2013 | Qiu | H02M 3/1584 323/272 |
| 2003/0102849 A1 * | 6/2003 | Schiff | H02M 3/1584 323/222 |
| 2006/0001408 A1 * | 1/2006 | Southwell | H02M 3/1584 323/282 |
| 2007/0257650 A1 * | 11/2007 | Southwell | H02M 3/1584 323/283 |
| 2008/0169797 A1 * | 7/2008 | Zambetti | H02M 3/1584 323/285 |
| 2009/0039849 A1 * | 2/2009 | Chang | G05F 1/575 323/282 |
| 2010/0020577 A1 * | 1/2010 | Dommaschk | H02M 7/19 363/63 |
| 2010/0033151 A1 * | 2/2010 | Wu | H02M 3/1584 323/285 |
| 2010/0045245 A1 * | 2/2010 | Hawley | H02M 3/1582 323/222 |
| 2010/0164477 A1 * | 7/2010 | Trivedi | G06F 1/26 324/107 |
| 2010/0244799 A1 * | 9/2010 | Moussaoui | H02M 3/1584 323/283 |
| 2010/0253431 A1 * | 10/2010 | Fujiwara | H03F 1/086 330/253 |
| 2011/0074508 A1 * | 3/2011 | Imura | G05F 1/565 330/253 |
| 2011/0188218 A1 * | 8/2011 | Hsing | H03K 17/687 361/772 |
| 2011/0254526 A1 * | 10/2011 | Luo | H02M 3/1584 323/284 |
| 2011/0267019 A1 * | 11/2011 | Krishnamurthy | H02M 3/1584 323/283 |
| 2012/0229104 A1 * | 9/2012 | Pierson | H02M 1/32 323/234 |

* cited by examiner

CURRENT SENSING DEVICE FOR A MULTI-PHASE SWITCHED VOLTAGE REGULATOR

BACKGROUND

1. Technical Field

The present disclosure relates to current sensing, and more particularly to a current sensing device for a multi-phase switched voltage regulator capable of generating sense currents representing the current unbalance of the phases in respect to the average current delivered by each phase, and the total current delivered by the voltage regulator.

2. Description of the Related Art

Multiphase voltage regulators are used in numerous applications, for example as power supplies in microprocessors for personal computers, workstations, servers, printers and other similar electronic equipment.

Voltage regulators allow a desired output voltage to be provided proportionally to the current required by the supplied load. This feature is commonly called "droop function" or "voltage positioning".

The droop function allows current sense devices to read or estimate the current delivered by the regulator. In general, current sense devices read the current as a voltage drop across a sense resistance, that may be a parasitic element of the voltage regulator. For example, in power switches, the sense resistance may be the on resistance of the switch or the parasitic resistance of the phase inductor (phase winding). Alternatively, the resistance may be a series of components purposely inserted in the circuit.

If a discrete sense resistance is used, a very precise current reading may be provided. Moreover, using constantan-made resistances, the current reading is almost independent from temperature variations.

Nevertheless, a drawback of this approach consists in being expensive and in lowering current conversion efficiency.

Using parasitic resistances of the switches of the regulator for sensing the delivered current is economical because no separate element is added to the regulator. Unfortunately, the current sensing may be less precise because of the spread of the value of the conduction resistance of each integrated switch and to the variations produced by fluctuations of the working temperature of the regulator.

Sensing the phase currents by exploiting the parasitic resistance of the phase winding is preferred because the reading tolerance may be contained within about 5%.

In general, a multiphase voltage regulator with N switches outputs a saw-tooth current with a period corresponding to T/N, wherein T is the switching period of the phases. Nevertheless, switched voltage regulators use a control circuit for controlling the phase differences between the input currents of the N switches, in order to balance the current delivered by each phase and attain an effective current sharing mode of operation.

In currently available voltage regulators, the presence of particularly precise components to meet stringent specifications, poses further problems. In particular, the ability of using ever smaller inductors makes the values of parasitic series resistances $R_L$ to be exploited as sense resistances comparable to the values of parasitic resistances on PC application boards, because of the unavoidable resistance of the metal vias therein.

As emphasized in FIG. 1, for a dual-phase regulator, the presence of the parasitic resistances Rp1 in series with the resistances $R_L$ implies that a current sensing circuit capable of discriminating the current sense information on the phase winding is used for correct sensing. The solution is to implement a so-called fully differential reading.

In a known device described in U.S. Pat. No. 5,982,160 an R-C current sense series connection is connected in parallel to each output inductor of the voltage regulator, as shown in FIG. 2. The values of the shunt resistor R and of the filter capacitor C of the R-C series connection are determined such to match the time constant of the circuit $R_L$-L (the phase winding and its parasitic series resistance) with the time constant of the R-C series connection. In this matching condition, it may be assumed that the DC component of the voltage drop on the phase winding be equal to the voltage on the filter capacitor of the R-C series connection.

Moreover, the current sense circuit current signal of each R-C network is analyzed together with the output signal through a resistance $R_G$ by a controller. In the case represented in FIG. 2b, a circuit is shown for estimating the output current of the dual-phase voltage regulator emphasizing that the controller has two dedicated pins for each R-C series connection.

The voltage regulator according to the prior approach, although advantageous under several points of view, requires a controller with 2*N pins for the total current reading, wherein N is the number of phases of the voltage regulator. This increases complexity of the regulator and silicon area requirement.

A known two-phase voltage regulator is described in U.S. Pat. No. 6,683,441 B2 and is shown in FIG. 3. The voltages of the two nodes, PHASE1 and PHASE2, are added by two resistances Rp connected in common and sent to an input of an operational amplifier, and the other input receives the output voltage of the regulator. In this case, a fully differential current reading cannot be provided because the output voltage VOUT is used as a reference voltage by the operational amplifier. Therefore, different parasitic resistances between the output of the regulator and each phase cause an error in sensing the delivered output current. Moreover, this prior architecture does not allow to sense each phase current.

Another known current sense circuit of a multi-phase voltage regulator is disclosed in the published U.S. patent application No. 2008/0169797 in the name of the same applicant, and is shown in FIG. 4. The current sense circuit composed by the operational amplifier and the controlled MOSFET uses only two pins for reading the mean current flowing through the inductances of the N phases of the voltage regulator.

Unfortunately, also this prior architecture does not allow to sense each phase current, neither a refined control of the current delivered by the voltage regulator by correcting the current unbalancing in each phase.

BRIEF SUMMARY

A novel current sensing device for sensing the total current and the current unbalance of each single phase in respect to the average current delivered by the same phase of a multiphase switched voltage regulator is proposed herein.

The current sensing device according to one embodiment of the present disclosure has a modular architecture and is composed of as many input modules as the phases of the voltage regulator and is adapted to generate as many sense currents representative of the difference between any single phase current and the average current delivered by the same phase.

According to one embodiment of this disclosure, each phase winding is connected in parallel to a respective R-C series connection of a shunt resistor with a filter capacitor, and the common node between the shunt resistors and the filter capacitors are accessible. Each input module comprises:
- an operational amplifier having an input coupled to the common node of the R-C series connection of the respective phase,
- a transistor controlled by the operational amplifier, having a first current terminal shorted to the other input of the operational amplifier, the sense current flowing through the transistor and being delivered through the second current terminal thereof,
- a bias constant current generator connected to the first current terminal of the transistor,
- an output resistor coupling the first terminal to an intermediate node of the current sensing device shared in common by all the modules.

The sense current Idroop representative of the total current delivered by the regulator is generated in one embodiment by an output stage including:
- an output operational amplifier having a first input shorted to said intermediate node,
- an output transistor controlled by said output operational amplifier, having a first current terminal shorted to a second input of the output operational amplifier, said sense current flowing through said output transistor and being delivered through a second current terminal thereof,
- a number N, equal to the number of phases of the voltage regulator, of identical sense resistors connected in common to said first current terminal of the output transistor and each connected to the winding of a respective phase of the regulator.

Preferred embodiments of the sensing device are defined in the dependent claims.

An innovative multi-phase switched voltage regulator, comprises phase inductors each connected in parallel to a respective R-C series connection of a shunt resistor with a filter capacitor, the common node between the shunt resistor and the filter capacitor of each R-C series connection being accessible, and the novel current sensing device.

The claims as filed are integral part of this description and are herein incorporated by reference.

DETAILED DESCRIPTION

Figure 1:
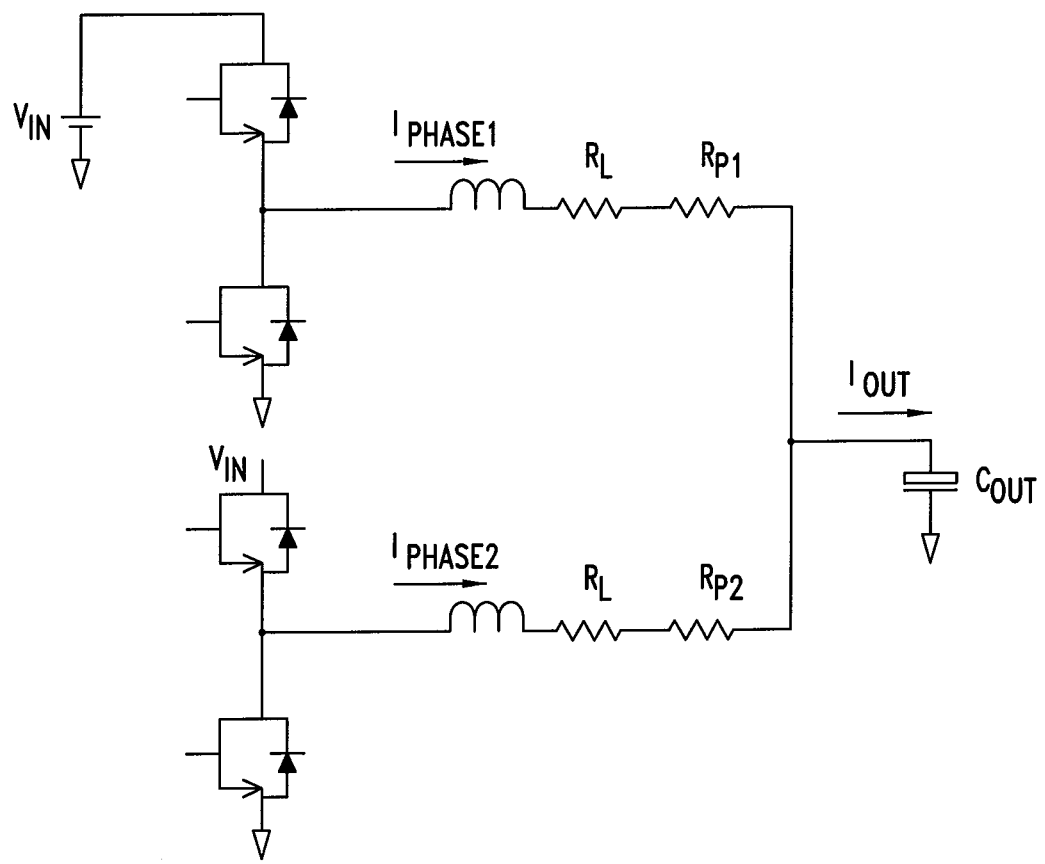
FIG. 1 basically depicts the equivalent circuit of a classic voltage regulator.
Figure 2A:
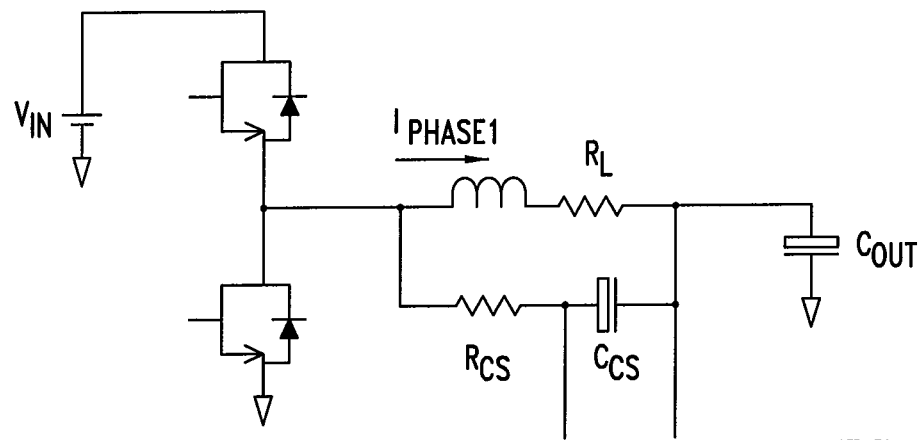
FIG. 2a depicts a phase of a prior voltage regulator disclosed in the document U.S. Pat. No. 5,982,160.
Figure 2B:
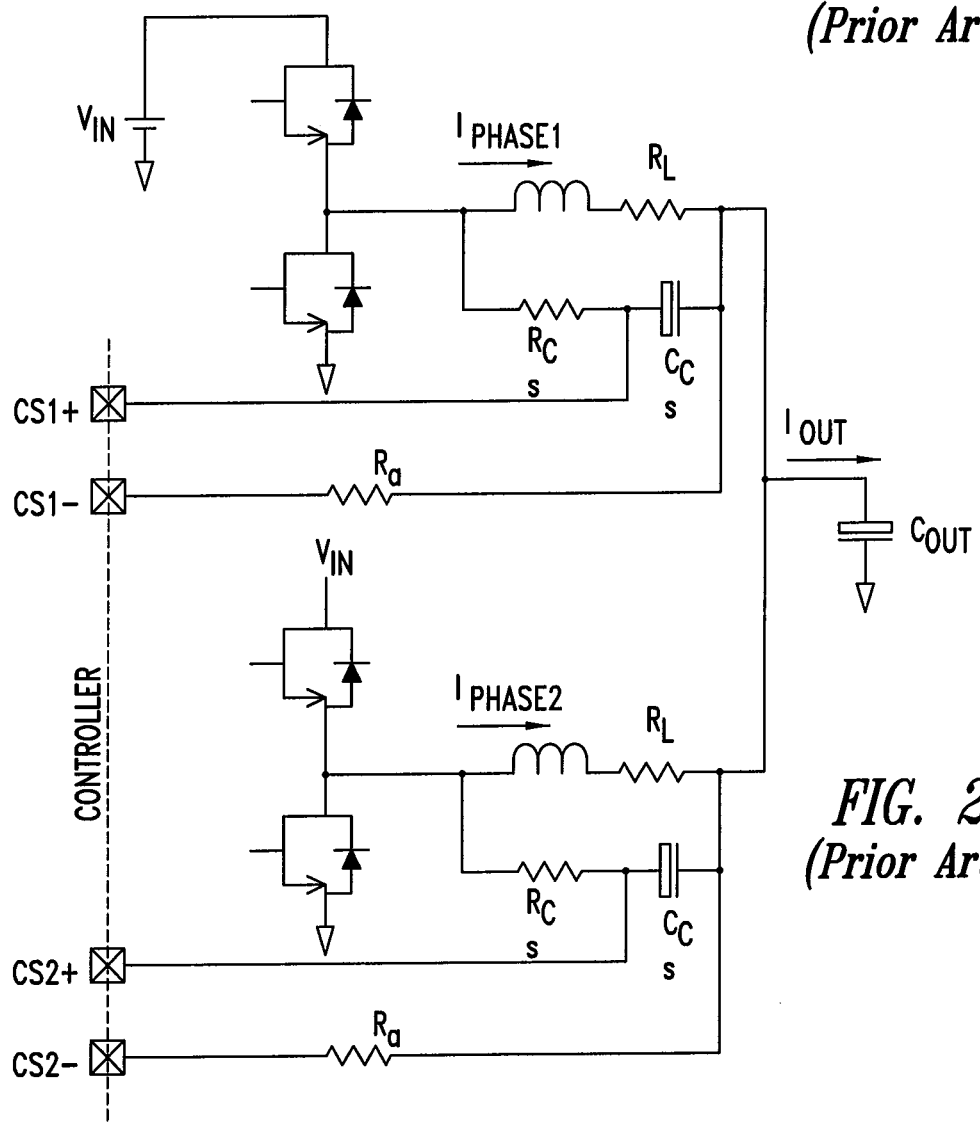
FIG. 2b depicts a phase of a prior voltage regulator and its current sensing device disclosed in the document U.S. Pat. No. 5,982,160.
Figure 3:
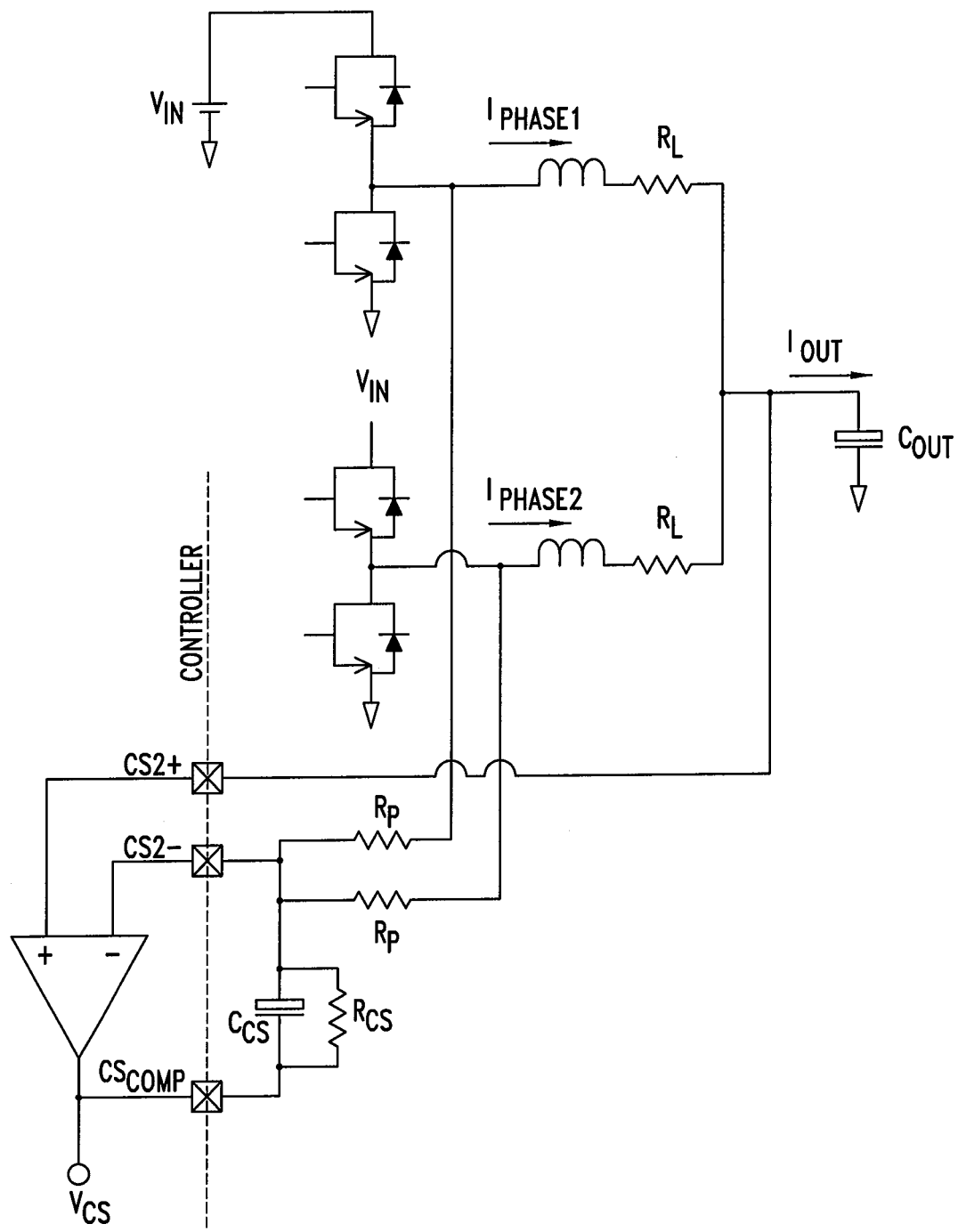
FIG. 3 depicts a prior two-phases voltage regulator and its current sensing device disclosed in the document U.S. pat. No. 6,683,441.
Figure 4:
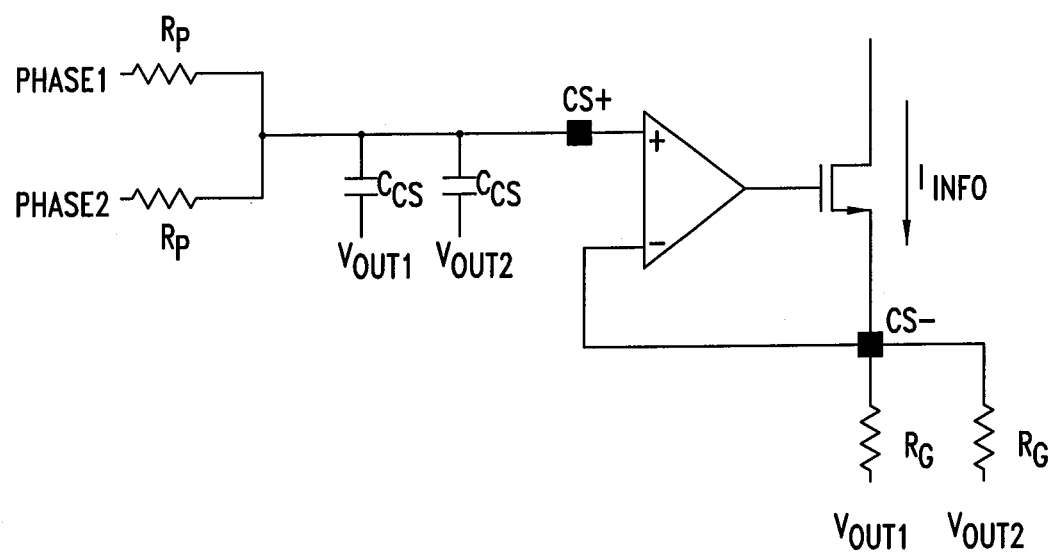
FIG. 4 depicts a prior current sensing device of a two-phases voltage regulator disclosed in the document U.S. 2008/169797.
Figure 5:
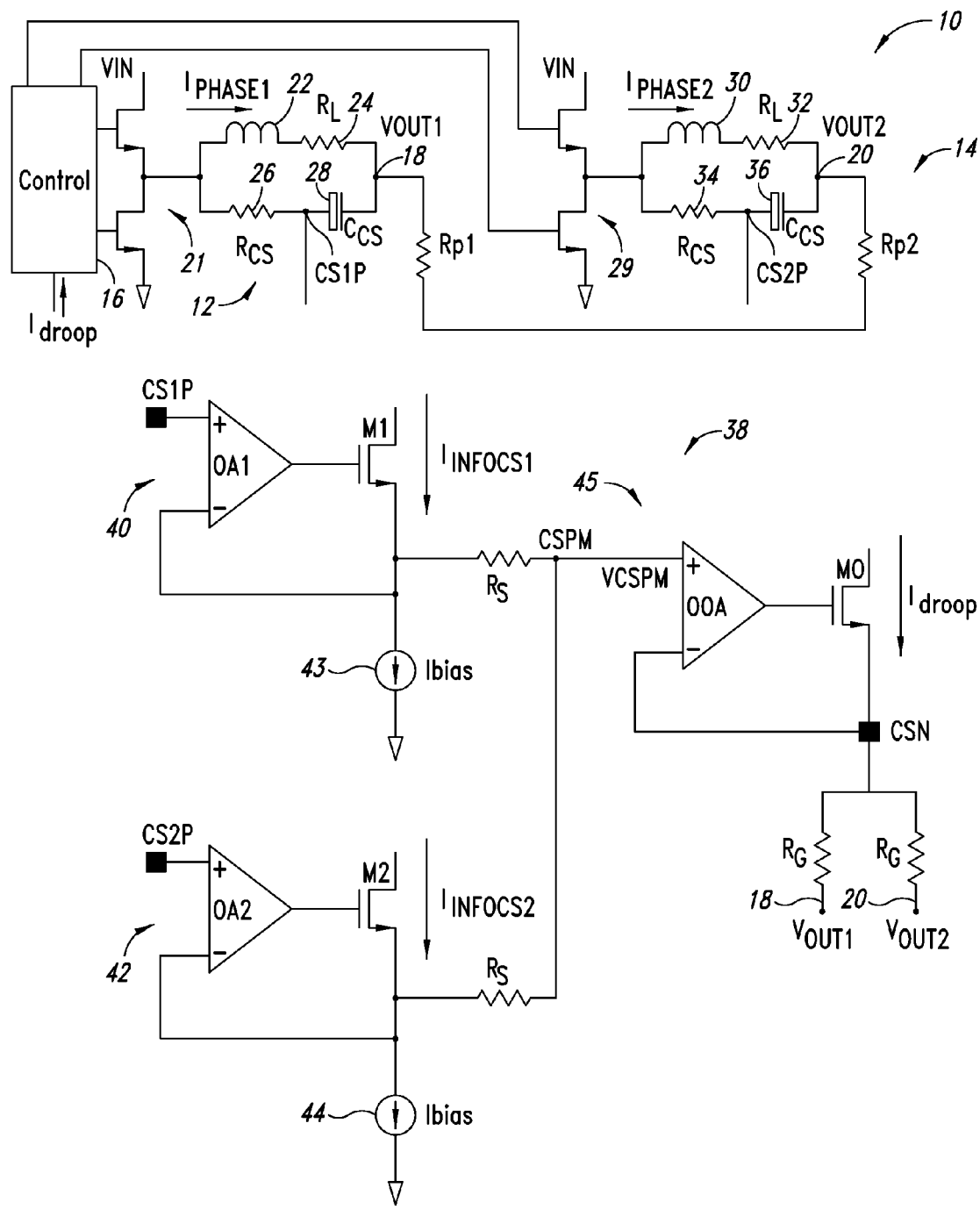
FIG. 5 shows a phase of a voltage regulator and an innovative current sensing device for sensing in a differential way each phase current and the output current delivered by the regulator.

In the ensuing description reference is made to a two-phase voltage regulator 10, shown in FIG. 5, though the same considerations apply *mutatis mutandis* for a generic N-phase voltage regulator. The voltage regulator 10 includes first and second phases 12, 14 that are controlled by a control circuit 16 and produce first and second regulated output voltages $V_{OUT1}$, $V_{OUT2}$ (generically $V_{OUTi}$) on first and second output terminals 18, 20, respectively. The first phase 12 includes a first bridge driver circuit 21, a first winding 22, with a resistor 24 of value $R_L$ representing the parasitic series resistance of the winding 22, coupled in parallel with a series-connection that includes a shunt resistor 26 of resistance value $R_{CS}$ and a filter capacitor 28 of capacitance value $C_{CS}$ coupled to each other at a first common node CS1P. The second phase 14 includes a second bridge driver circuit 29, a second winding 30, with a resistor 32 of value $R_L$ representing the parasitic series resistance of the winding 30, coupled in parallel with a series-connection that includes a shunt resistor 34 of resistance value $R_{CS}$ and a capacitor 36 of capacitance value $C_{CS}$ coupled to each other at a second common node CS2P.

A novel architecture of a current sensing device 38 for the switching voltage regulator 10 is shown in FIG. 5 together with the two phases 12, 14 of the regulator and the control circuit 16, in order to show how the current sensing device 38 is connected.

In general, the novel current sensing device 38 comprises a number N of input modules 40, 42, with N being equal to the number of phases of the voltage regulator 10, each comprising an operational amplifier OA1, OA2 having a first input (that, in the embodiment of FIG. 5, is the non-inverting input) connected to the common node CS1P, CS2P (generically CSiP) of the corresponding R-C series connection between the shunt resistance 26, 34 and the filter capacitance 28, 36 of the respective phase 12, 14 of the regulator 10. Each input module 34, 36 also includes a transistor M1, M2 (generically Mi), that in the exemplary embodiment of FIG. 5 is a MOSFET, biased with a fixed bias current Ibias by a current generator 43, 44 connected to a first current terminal of the respective transistor M1, M2.

Each transistor M1, M2 controlled by the respective operational amplifier OA1, OA2 is connected to deliver, through a second current terminal (that in the exemplary embodiment of FIG. 5 is the drain), a current $I_{INFOCS1}$, $I_{INFOCS2}$ (generically $I_{INFOCSi}$) representative of the current unbalance of the respective phase current $I_{PHASE1}$, $I_{PHASE2}$ (generically $I_{PHASEi}$) with respect to the average current delivered by each phase.

The input operational amplifiers OA1, OA2 replicate the voltage applied on their first input on their second input (that in the exemplary embodiment is the inverting input) connected to the first current terminal (for example, the source) of the respective transistor M1, M2 they control, that is:

$$VCSiP = I_{PHASEi} * R_L + V_{OUTi}.$$

The first current terminals of all transistors Mi are coupled together to a common intermediate node CSPM at a voltage VCSPM through identical resistances $R_S$.

In the embodiment of FIG. 5 in which only two phases are considered, the voltage VCSPM is:

$$VCSPM = \frac{I_{PHASE1} + I_{PHASE2}}{2} \cdot R_L + \frac{V_{OUT1} + V_{OUT2}}{2}.$$

Therefore, the currents $I_{INFOCS1}$ and $I_{INFOCS2}$ delivered by the transistors M1 and M2 are $$I_{INFOCS1} = Ibias + \frac{I_{PHASE1} - I_{PHASE2}}{2R_S} \cdot R_L + \frac{V_{OUT1} - V_{OUT2}}{2R_S}$$

$$I_{INFOCS2} = Ibias - \frac{I_{PHASE1} - I_{PHASE2}}{2R_S} \cdot R_L - \frac{V_{OUT1} - V_{OUT2}}{2R_S}.$$

With $I_M$ being the average current delivered by each phase of the regulator, $$I_M = \frac{I_{PHASE1} + I_{PHASE2}}{2}$$

then $$I_{INFOCS1} = Ibias + \frac{R_L}{R_S} \cdot I_{PHASE1} - \frac{R_L}{R_S} \cdot I_M + \frac{V_{OUT1} - V_{OUT2}}{2R_S}$$

$$I_{INFOCS2} = Ibias + \frac{R_L}{R_S} \cdot I_{PHASE2} - \frac{R_L}{R_S} \cdot I_M - \frac{V_{OUT1} - V_{OUT2}}{2R_S}.$$

Therefore, $I_{INFOCS1}$ and $I_{INFOCS2}$ may be considered proportional to the current unbalance of the respective phase current with respect to the average current delivered by each phase, provided that the error term $$\frac{V_{OUT1} - V_{OUT2}}{2R_S}$$

is negligible.

The error term is due to eventual mismatches between the parasitic resistances Rp1 and Rp2 of the lines that connect the output nodes 18, 20 of the phases, at the voltages $V_{OUT1}$ and $V_{OUT2}$, to the common output terminal of the voltage regulator. Usually the difference $V_{OUT1} - V_{OUT2}$ is relatively small because these parasitic resistances may be accurately matched to each other, thus the error term is in practice negligible.

The current sensing device 12 has an output stage 45 that senses in a differential manner the total current delivered by the voltage regulator 10. Such an output stage 45 comprises an operational amplifier OOA, a transistor MO, and identical resistances $R_G$ connected between a common terminal CSN and the output nodes 18, 20 of the respective phases of the regulator 10. The operational amplifier OOA controls the transistor MO, which delivers to the control circuit 16 a current $I_{DROOP}$ representative of the total current delivered by the voltage generator The amplifier OOA replicates on the terminal CSN the voltage VCSPM, thus the current $I_{DROOP}$ is $$I_{DROOP} = \frac{I_{PHASE1} + I_{PHASE2}}{R_G} \cdot R_L + \frac{V_{OUT2} - V_{OUT1}}{R_G} + \frac{V_{OUT1} - V_{OUT2}}{R_G}$$

$$= \frac{R_L}{R_G} \cdot (I_{PHASE1} + I_{PHASE2})$$

i.e., it is proportional to the total current delivered by the voltage regulator.

The novel current sensing device 38 has N+1 pins (CSiP and CSN) and is capable of generating in a fully differential manner a current $I_{DROOP}$ representative of the total current delivered by the switching voltage regulator 10, and with good precision currents $I_{INFOCS1}$, $I_{INFOCS2}$ representative of the unbalance of the N phase currents. Therefore, it provides the desired information to the control circuit 16 for driving the phases of the voltage regulator with an accurate current sharing condition.

Even if the above description refers to a two-phase voltage regulator, the novel architectures may be easily adapted whichever the number N of phases of the regulator is, simply by realizing as many identical input modules of the current sensing device as the number N of phases and by coupling all nodes VCSiP to a same common node CSPM through identical resistances $R_S$. Similarly, the output stage of the current sensing device will comprise N identical resistances $R_G$ connected in common to the terminal CSN and to the respective phase winding as shown in FIG. 5.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A current sensing device for sensing phase currents of a multi-phase switched voltage regulator having phase windings and R-C series couplings respectively coupled to the phase windings, each R-C series coupling including a shunt resistor and a filter capacitor coupled to each other at a first intermediate node of the R-C series coupling, the current sensing device comprising:
   a plurality of input modules configured to be coupled to respective phase windings of the regulator and configured to deliver sense currents representing unbalances of respective phase currents of the regulator with respect to an average current delivered by each phase winding, each input module including:
   an operational amplifier having a first input configured to be coupled to said first intermediate node of the R-C series coupling of the respective phase,
   a transistor having a control input coupled to an output of said operational amplifier, a first current terminal coupled to a second input of the operational amplifier, and a second current terminal configured to provide a respective one of said sense currents,
   a constant current generator to provide a constant current and to bias said transistor through said first current terminal, and
   an output resistor coupling said first terminal to a second intermediate node shared in common by all said modules; and
   an output stage configured to deliver another sense current representative of a total current delivered by the regulator, the output stage including:
   an output operational amplifier having a first input coupled to said second intermediate node,
   an output transistor having a control terminal coupled to an output of said output operational amplifier, a first current terminal coupled to a second input of the output operational amplifier, and a second current terminal configured to provide said another sense current, and
   a plurality of sense resistors, equal in number to the input stages, coupled in common to said first current terminal of the output transistor and each configured to be coupled to the respective phase winding of the regulator.

2. The current sensing device of claim 1, wherein said first input of each operational amplifier is a non-inverting input, and said second input of each operational amplifier is an inverting input.

3. A multi-phase switched voltage regulator, comprising:
   a plurality of phase windings;
   a plurality of R-C series connections respectively coupled to the phase windings; each R-C series connection including a shunt resistor and a filter capacitor coupled to each other at a first intermediate node; and a current sensing device that includes:

a plurality of input modules coupled respectively to the phase windings and configured to deliver sense currents representing unbalances of respective phase currents of the regulator with respect to an average current delivered by each phase winding, each input module including:

an operational amplifier having a first input coupled to said first intermediate node of the R-C series coupling of the respective phase, a transistor having a control input coupled to an output of said operational amplifier, a first current terminal coupled to a second input of the operational amplifier, and a second current terminal configured to provide a respective one of said sense currents, a constant current generator to provide a constant current and to bias said transistor through said first current terminal, and an output resistor coupling said first current terminal to second intermediate node shared in common by all said modules; and an output stage configured to deliver another sense current representative of a total current delivered by the regulator, the output stage including:

an output operational amplifier having a first input coupled to said second intermediate node, an output transistor having a control terminal coupled to an output of said output operational amplifier, a first current terminal coupled to a second input of the output operational amplifier, and a second current terminal configured to provide said another sense current, and a plurality of sense resistors, equal in number to the input stages, coupled in common to said first current terminal of the output transistor and respectively coupled to the phase windings.

4. The multi-phase switched voltage regulator of claim 3, wherein each R-C series connection has a time constant that matches a time constant of the respective phase winding.

5. The multi-phase switched voltage regulator of claim 3, wherein said first input of each operational amplifier is a non-inverting input, and said second input of each operational amplifier is an inverting input.

6. A current sensing device for sensing phase currents of a multi-phase switched voltage regulator having phase windings, the current sensing device comprising:

a plurality of input modules configured to be coupled to respective phase windings of the regulator and configured to deliver sense currents representing unbalances of respective phase currents of the regulator with respect to an average current delivered by each phase winding, each input module including:

an operational amplifier having a first input configured to be coupled to said respective phase winding;

a transistor having a control input coupled to an output of said operational amplifier, a first current terminal coupled to a second input of the operational amplifier, and a second current terminal configured to provide a respective one of said sense currents;

a constant current generator to provide a constant current and to bias said transistor through said first current terminal; and an output resistor coupling said first terminal to an intermediate node shared in common by all said modules; and an output stage configured to deliver another sense current representative of a total current delivered by the regulator, the output stage including:

an output operational amplifier having a first input coupled to said intermediate node, and an output transistor having a control terminal coupled to an output of said output operational amplifier, a first current terminal coupled to a second input of the output operational amplifier, and a second current terminal configured to provide said another sense current.

7. The current sensing device of claim 6, wherein said first input of each operational amplifier is a non-inverting input, and said second input of each operational amplifier is an inverting input.

8. The current sensing device of claim 6, wherein the output stage includes a plurality of sense resistors, equal in number to the input stages, coupled in common to said first current terminal of the output transistor and each configured to be coupled to the respective phase winding of the regulator.

* * * * *